United States Patent
Yamaguchi et al.

(10) Patent No.: US 6,733,614 B2
(45) Date of Patent: May 11, 2004

(54) PROCESS FOR FORMING THERMAL CONDUCTIVE SHEET

(75) Inventors: Akio Yamaguchi, Nagoya (JP); Hideharu Kawai, Nagoya (JP); Yasuhiro Kawaguchi, Nagoya (JP)

(73) Assignee: Kitagawa Industries Co., Ltd., Nagoya (JP)

( * ) Notice: Subject to any disclaimer, the term of this patent is extended or adjusted under 35 U.S.C. 154(b) by 0 days.

(21) Appl. No.: 10/358,425

(22) Filed: Feb. 4, 2003

(65) Prior Publication Data
US 2003/0143412 A1 Jul. 31, 2003

Related U.S. Application Data

(62) Division of application No. 09/923,509, filed on Aug. 6, 2001, now abandoned.

(30) Foreign Application Priority Data

Aug. 10, 2000 (JP) ........................................ 2000-242788

(51) Int. Cl.[7] ............................ B32B 5/16; B32B 31/06; B32B 31/20; B32B 33/00
(52) U.S. Cl. ...................... 156/276; 428/323; 428/327; 428/328; 428/330
(58) Field of Search ........................... 156/81, 230–235, 156/237–239, 276, 280, 307.5; 428/214, 215, 323, 332, 337, 447, 450

(56) References Cited

U.S. PATENT DOCUMENTS

| | | |
|---|---|---|
| 3,959,063 A | 5/1976 | Hawthorne |
| 4,097,650 A | 6/1978 | Shirahata et al. |
| 4,287,114 A | 9/1981 | Itoh et al. |
| 4,534,815 A | 8/1985 | Hamada et al. |
| 5,221,575 A | 6/1993 | Nakano et al. |
| 5,490,895 A | 2/1996 | Wang et al. |
| 5,741,579 A | 4/1998 | Nishizawa |
| 5,753,361 A | 5/1998 | Visser |
| 6,106,895 A | 8/2000 | Usuki |

*Primary Examiner*—Richard Crispino
*Assistant Examiner*—Sing P Chan
(74) *Attorney, Agent, or Firm*—Davis & Bujold PLLC

(57) ABSTRACT

A thermal conductive sheet with conductive foil is obtained by press bonding a magnetic foil to a thermal conductive layer via a primer layer. Since the primer layer contains a thermal conductive filler, it has high thermal conductivity and does not interrupt thermal conduction from the thermal conductive layer to the magnetic foil. It also spontaneously destroys a skin layer on the surface of the thermal conductive layer upon the press bonding. Accordingly, the thermal conductive sheet with conductive foil of the present invention improves thermal conduction from the thermal conductive layer to the conductive foil, eliminating the unfavorable effects of the skin layer and the primer layer, and thus improves heat radiation of the thermal conductive sheet with conductive foil.

8 Claims, 1 Drawing Sheet

PROCESS FOR FORMING THERMAL CONDUCTIVE SHEET

Figure 1:
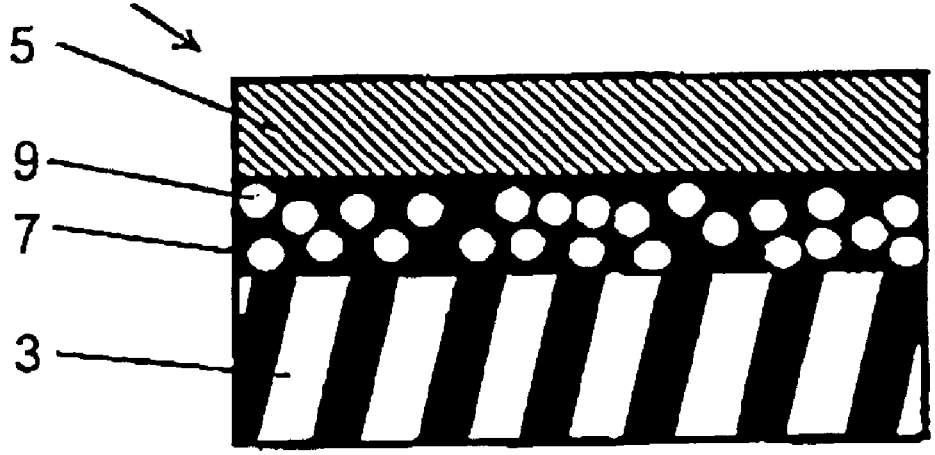

This is a divisional application of Ser. No. 09/923,509 filed Aug. 6, 2001 now abandoned.

FIELD OF THE INVENTION

This invention relates to a thermal conductive sheet with conductive foil produced by press bonding a thermal conductive sheet and conductive foil via a primer layer.

BACKGROUND OF THE INVENTION

A thermal conductive sheet has been generally produced by kneading and forming a material, such as silicone rubber and EPDM, with a thermal conductive filler. Such a thermal conductive sheet is arranged, for example, between a heat-generating electronic component and a heat sink such as a heat dissipation plate or a metal case panel, inside an electric/electronic apparatus to efficiently radiate the heat produced from the electronic component. Therefore, such thermal conductive sheet is in demand and regarded as essential for increasing in speed of the CPUs, for example.

Additionally in the electric/electronic apparatus, external electromagnetic waves may be superimposed on the input/output signals of the electronic component, such as a CPU, as noise, or electromagnetic waves generated by the electronic component itself may be superimposed on the other signals as noise. To protect the electronic component from the influence of the external electromagnetic waves as well as to interfere with the electromagnetic waves generated by the electronic component, conductive foil may be adhered to one side of the above thermal conductive sheet facing the heat sink. Since the conductive foil is generally composed of metal having a high thermal conductivity, presence of the conductive foil between the thermal conductive sheet and the heat sink does not inhibit radiation of the thermal conductive sheet.

During the process of forming the thermal conductive sheet, however, a skin layer is formed on the surface of the thermal conductive sheet, and there is the possibility that this skin layer may interrupt thermal conduction from the thermal conductive sheet to the conductive foil. Although the skin layer can be removed by preprocessing, an uneven surface of the thermal conductive sheet is created. As a result, low adhesion between the thermal conductive sheet and the conductive foil occurs and causes reduction of thermal conductivity. Additionally, when the conductive foil is adhered to the thermal conductive sheet, it is conventional to provide a primer layer between them so as to improve the adhesion. In this case, however, the primer layer may also interrupt the thermal conduction from the thermal conductive sheet to the conductive foil.

SUMMARY OF THE INVENTION

An object of the present invention, in the thermal conductive sheet with conductive foil produced by press bonding the thermal conductive sheet and the conductive foil via a primer layer, is to improve thermal conduction from the thermal conductive layer to the conductive foil and thus to improve heat radiation of the thermal conductive sheet with conductive foil.

In order to attain the above object, a thermal conductive sheet with conductive foil of the present invention is produced by press bonding a thermal conductive layer and conductive foil via a primer layer into which a thermal conductive filler in the form of powder, chop, whisker or fiber is mixed.

As a base material of the primer layer, silane compound, titanate compound, alminate compound, caboxylic acid compound and phosphate compound can be used.

Since the primer layer of the present invention has the thermal conductive filler mixed into it, it does not interrupt thermal conduction from the thermal conductive sheet from the conductive foil. The thermal conductive filler is in the form of powder, chop, whisker or fiber, and the thermal conductive layer and the conductive foil are press bonded via the primer layer into which the thermal conductive filler is mixed. Accordingly, the thermal conductive filler, at the time of the press bonding, mechanically destroys a skin layer on the surface of the thermal conductive layer. Therefore, the thermal conduction from the thermal conductive layer to the conductive foil is not hindered by the skin layer at all.

The thermal conductive sheet with conductive foil of the present invention improves thermal conduction from the thermal conductive layer to the conductive foil, eliminating the negative effect of the skin layer and the primer layer, and thus improves heat radiation of the thermal conductive sheet with conductive foil. In addition, because the thermal conductive layer and the conductive foil are press bonded via the primer layer, the thermal conductive sheet with conductive foil of the present invention is superior in strength.

In the present invention, magnetic foil is employed as the conductive foil. Accordingly, the electromagnetic waves shielding effect of the conductive foil is further improved. Therefore, in addition to the previously mentioned advantages, the thermal conductive sheet with conductive foil of the present invention efficiently prevents the external electromagnetic waves from being superimposed on the input/output signals of the electronic component as well as prevents the electromagnetic waves generated by the electronic component itself from being superimposed on the other signals.

BRIEF DESCRIPTION OF THE DRAWING FIGURES

The invention will now be described, by way of example, with reference to the accompanying drawing, in which:

A single FIGURE is an explanatory view illustrating a schematic structure of a thermal conductive sheet with conductive foil according to the present invention.

DETAILED DESCRIPTION OF THE INVENTION

Firstly, a thermal conductive sheet as a thermal conductive layer of the present invention is produced as follows.

By mixing a fluid base material, a thermal conductive filler and oil, the thermal conductive filler is dispersed in the base material. Paraffin or polyethylene rubber or resin can be used as the base material having thermoplasticity, and silicone rubber or other synthetic rubber can be used as the base material having thermosetting properties. As the thermal conductive filler, alumina, silicon carbide, boron nitride, metal oxide, metallic powder and so on can be used.

For mixing the base material and the filler, an extrusion machine, a two-roll machine, a kneader, a planetary mixer can be used. Such solid-form base material kneaded with the thermal conductive filler is formed into a sheet, and the thermal conductive sheet is obtained. A calendar roller, an extrusion machine, a press machine, a coater and the like can be used for the press molding.

With the use of the above-described thermal conductive sheet as the thermal conductive layer, the thermal conductive sheet with conductive foil of the present invention will now be produced. A single FIGURE shows an explanatory view illustrating a schematic structure of a thermal conductive sheet with conductive foil of the present embodiment. As seen in the FIGURE, the thermal conductive sheet 1 with conductive foil of the embodiment is obtained by press bonding magnetic foil 5, which is conductive foil made of magnetic metallic foil, to the thermal conductive layer 3 made as above via a primer layer 7. As base materials of the primer layer 7, silane compounds, titanate compounds, alminate compounds, caboxylic acid compounds and phosphate compounds can be used. A silane compound, for example, is a silane coupling material such as γ-methacryloxypropyl trimethoxy silane, γ-aminopropyl triethoxysilane and poly ethoxy dimethylsiloxane. The primer layer 7 is made from a mixture of the above mentioned compounds and a solvent such as xylene, cyclohexane and ethyl acetate. Before the press bonding, the primer layer 7 is kneaded with the same thermal conductive filler 9 as that used in the thermal conductive layer 3, and it is adhered to the magnetic foil 5. After the press bonding, the thermal conductive layer 3 is vulcanized so that the base material attains an elastomeric state. Thus the thermal conductive sheet 1 with conductive foil of the present embodiment is obtained.

The primer layer 7 of the thermal conductive sheet 1 with conductive foil has the dispersed thermal conductive filler 9. Accordingly, the primer layer 7 has high thermal conductivity and does not interrupt the thermal conduction from the thermal conductive layer 3 to the magnetic foil 5. The thermal conductive filler 9 is in the form of powder, chop, whisker or fiber, and via the primer 7 which contains the thermal conductive filler 9 the thermal conductive layer 3 and the magnetic foil 5 are press bonded. Therefore, upon the press bonding, the thermal conductive filler 9 spontaneously destroys a skin layer on the surface of the thermal conductive layer 3.

In other words, the skin layer with low thermal conductivity is formed on the surface of the thermal conductive layer 3 when the thermal conductive layer 3 is formed into a sheet. Nevertheless, the skin layer does not interrupt the thermal conduction from the thermal conductive layer 3 to the magnetic foil 5, because the skin layer of the thermal conductive sheet 1 with conductive foil is destroyed. Therefore, the thermal conductive sheet with conductive foil of the present invention improves thermal conduction from the thermal conductive layer to the conductive foil, eliminating the unfavorable effects of the skin layer and the primer layer, and thus improves heat radiation of the thermal conductive sheet with conductive foil. In addition, because the thermal conductive layer and the conductive foil are press bonded via the primer layer, the thermal conductive sheet with conductive foil of the present invention is superior in strength.

EXAMPLE

The present invention will be now specifically described with reference to an example. The thermal conductive sheet 1 with conductive foil is actually produced and the difference in properties derived from the amount of the thermal conductive filler 9 is examined. Firstly, EPDM (ethylene-propylene-diene terpolymer), as the base material, and silicon carbide, as the thermal conductive filler, are kneaded and formed by a press machine (or a calendar roller) to obtain the thermal conductive layer 3. Then, by press bonding the thermal conductive layer 3 and the magnetic foil 5 via the primer layer 7 containing different amounts of alumina powder, the thermal conductive sheet 1 with conductive foil is produced. The primer layer 7 of the present example comprises a mixture of γ-methacryloxypropyl trimethoxy silane and xylene. As for the magnetic foil 5, a flat-rolled magnetic material such as Fe—Si, Fe—Cr, Fe—Si—Al, Fe, Fe—Ni, Fe-based nanocrystal, or amorphous one can be used. Additionally, as a comparison, the thermal conductive sheet 1 and the magnetic foil 5 are press bonded via the primer layer 7 containing no alumina powder, and other thermal conductive sheet with conductive foil are produced. The thermal conductivity of each thermal conductive sheet produced are shown in Table 1.

TABLE 1

| Amount of alumina powder in primer layer (wt. %) | Thermal conductivity (W/m · k) |
| --- | --- |
| 0 | 1.71 |
| 10 | 1.77 |
| 20 | 1.88 |
| 30 | 1.84 |
| 50 | 1.82 |

Table 1 shows that a thermal conductive sheet with conductive foil having the primer layer 7 with alumina powder has higher thermal conductivity than the one with no alumina powder. The reason for this is, assumedly, because when the thermal conductive layer 3 and the magnetic foil 5 are press bonded via the primer layer 7, the skin layer on the surface of the thermal conductive layer 3 is spontaneously destroyed by alumina powder in the primer layer 7. Additionally, Table 1 indicates that although thermal conductivity is increased in accordance with the increase of alumina powder contained in the primer layer 7, it starts to decrease after it reaches its peak at approximately 20 weight % of alumina powder.

The present invention is not limited to the above embodiment, and other modifications and variations are possible within the scope of the present invention. For instance, aluminum hydroxide can be substituted for the thermal conductive filler contained in the primer layer. Foil made by vapor deposition of PVD or CVD can be used as the magnetic foil. Aluminum foil, iron foil and copper foil are also included in metallic foil (one form of conductive foil). The combination of materials to be used for the thermal conductive layer, the conductive foil, the primer layer and the thermal conductive filler contained in the primer layer can be freely chosen from the previously mentioned materials.

What is claimed is:

1. A process of forming a thermal conductive sheet between a heat producing element and a heat dissipating element, the process comprising the steps of:

forming a primer layer having a base material containing a thermal conductive filler, and using one of a powder, a chop, a whisker and a fiber as the thermal conductive filler;

sandwiching the primer layer between a conductive foil and a thermal conductive layer to facilitate adherence and achieve thermal conductivity between the conductive foil and the thermal conductive layer; and mechanically destroying a skin layer of a first surface of a thermal conductive layer during press bonding to enhance thermal conductivity of the skin layer.

2. The process according to claim 1, further comprising the step of press bonding the thermal conductive layer to the conductive foil via the primer layer.

3. The process according to claim 1, further comprising the step of using a conductive magnetic foil as the conductive foil.

4. The process according to claim 1, further comprising the step of using a flat rolled magnetic material selected from the group comprising Fe—Si, Fe—Cr, Fe—Si—Al, Fe, Fe—Ni, Fe-based nanocrystal as the conductive foil.

5. The process according to claim 1, further comprising the step of fabricating the primer layer from a thermoplastic base material selected from the group comprising paraffin, polyethylene, rubber or resin; and selecting thermal conductive filler from the group comprising alumina, silicon carbide, boron nitride, metal oxide and metallic powder.

6. A process of forming a thermal conductive sheet between a heat producing element and a heat dissipating element, the process comprising the steps of:

forming a primer layer having a base material containing a thermal conductive filler, and using one of a powder, a chop, a whisker and a fiber as the thermal conductive filler;

sandwiching the primer layer between a conductive magnetic foil and a thermal conductive layer to facilitate adherence and achieve thermal conductivity between the conductive magnetic foil and the thermal conductive layer; and press bonding the thermal conductive layer to the conductive magnetic foil to mechanically destroy a skin layer on a first surface of the thermal conductive layer, during the press bonding step, so as to enhance thermal conductivity of the first surface.

7. The process according to claim 6, further comprising the step of using a flat rolled magnetic material selected from the group comprising Fe—Si, Fe—Cr, Fe—Si—Al, Fe, Fe—Ni, Fe-based nanocrystal as the conductive foil;

fabricating the primer layer from a thermoplastic base material selected from the group comprising paraffin, polyethylene, rubber or resin; and selecting thermal conductive filler from the group comprising alumina, silicon carbide, boron nitride, metal oxide and metallic powder.

8. A process of forming a thermal conductive sheet between a heat producing element and a heat dissipating element, the process comprising the steps of:

providing a conductive foil;

forming a primer layer having a base material selected from the group comprising paraffin, polyethylene, rubber or resin and containing a thermal conductive filler selected from the group comprising alumina, silicon carbide, boron nitride, metal oxide, metallic powder, a powder, a chop, a whisker and a fiber;

forming a thermal conductive layer into a sheet with the thermal conductive layer containing a thermal conductive filler comprising the same thermal conductive filler used in the primer layer with an outer skin being formed on outer surface of the thermal conductive layer;

sandwiching the primer layer between the conductive foil and the thermal conductive layer;

press bonding the conductive foil to the thermal conductive layer with the primer layer located therebetween such that the thermal conductive filler mechanically destroys the outer skin layer formed on the outer surface of the thermal conductive layer to facilitate adherence and enhance thermal conductivity between the conductive foil and the thermal conductive layer.

* * * * *